United States Patent [19]

Kash et al.

[11] Patent Number: 5,528,616
[45] Date of Patent: Jun. 18, 1996

[54] ASYMMETRIC DUAL WAVEGUIDE LASER

[75] Inventors: Jeffrey A. Kash, Pleasantville, N.Y.; Bardia Pezeshki; Franklin F. Tong, both of Stamford, Conn.

[73] Assignee: International Business Machines Corporation, Armonk, N.Y.

[21] Appl. No.: 427,537

[22] Filed: Apr. 24, 1995

[51] Int. Cl.⁶ ........................................... H01S 3/19
[52] U.S. Cl. ........................ 372/45; 372/92; 372/99
[58] Field of Search .................. 372/20, 32, 23, 372/45, 92, 99, 50

[56] References Cited

U.S. PATENT DOCUMENTS

| | | | |
|---|---|---|---|
| 4,715,672 | 12/1987 | Duguay et al. | 372/45 |
| 4,730,327 | 3/1988 | Gordon | 372/45 |
| 5,343,542 | 8/1994 | Kash et al. | 372/45 |
| 5,422,898 | 6/1995 | Kash et al. | 372/23 |

*Primary Examiner*—James W. Davie
*Attorney, Agent, or Firm*—Douglas W. Cameron

[57] ABSTRACT

An apparatus is described for obtaining single frequency laser operation in a coupled waveguide configuration without using a diffraction grating. More specifically, this invention is a laser structure for oscillating light in single longitudinal mode. This structure has a pair of coupled but dissimilar waveguides that are collinear with each other and separated by a mirror in contact with each of the guides. The length of the waveguides are adjusted so that frequency selective coupling between the waveguides can discriminate between wavelengths corresponding to different longitudinal modes.

6 Claims, 3 Drawing Sheets

ASYMMETRIC DUAL WAVEGUIDE LASER

DESCRIPTION

1. Technical Field

This invention relates to a method of obtaining single frequency laser operation in a coupled waveguide configuration without the use of a diffraction grating.

2. Description of the Prior Art

In many applications one requires a single frequency solid state laser source. For example in fiber communications where high speed signals are transmitted optically in a fiber for a long distance, different laser modes will propagate down the fiber at different speeds (dispersion), and thus a signal pulse that contains many wavelengths will spread out with time, limiting the bandwidth of the channel. At short distances, the relative powers in the modes fluctuate and cause excessive noise.

Conventional Fabry-Perot (F-P) lasers have a multi-mode spectrum, and are thus inadequate for many communications applications. Their waveguides are usually about 300 μm long, with Fabry-Perot modes every few Å. The only frequency dependent parameter is the spectral shape of the material's gain curve. Since the gain is relatively flat over many longitudinal modes, these F-P lasers usually emit in many modes simultaneously. Though single frequency lasers exist, they are much more difficult to manufacture, and thus more expensive. These Distributed Feedback (DFB) lasers contain a diffraction grating internal to their structure and thus emit at only the wavelength where the grating is reflective. DFB lasers are usually produced by a two step growth and holographic or electron-beam lithography. Unfortunately, due to the increased complexity of such a laser, these devices are hard to manufacture and more expensive than the simple F-P lasers. What is required is a simple process to stabilize the output spectrum of a laser without requiring fine gratings and growth interrupts.

Furthermore, the light produced by such lasers cannot easily be coupled to optical fibers. The high refractive index of the semiconductor and the asymmetric cross section of the guiding region means that the light produced by the laser is elliptical and often astigmatic. To get good coupling to an optical fiber one needs to correct the beam using optical components such as cylindrical lenses and prism pairs, further increasing the total cost. Frequently, the undesired beam shape is left uncorrected with a correspondingly high insertion loss. Since the signal to noise ratio is determined by the amount of light that in the fiber, the poor coupling can be a significant limitation.

Recently a new kind of laser has been invented that is low cost and single frequency, but it is inappropriate for communications since it produces only a modest amount of optical power. These vertical cavity surface-emitting lasers (VCSELs) have introduced a new set of trade-offs. In these structures, the light propagates perpendicularly to the epitaxial layers and reflects from multi-layer mirrors fabricated from many ¼ wave thick layers. They can operate single mode, not so much from the wavelength selectivity of the distributed mirrors, but because the cavity length is extremely short. Thus there is only one longitudinal mode within the gain bandwidth of the semiconductor. Such distributed mirrors are much simpler to fabricate than lithographic gratings in the waveguide DFB lasers. Epitaxial growth methods have simple control over the vertical layer structures, with atomic layer precision. Furthermore, these ¼-wave mirrors require no growth interrupt and regrowth.

The same short cavity and high reflectivity mirrors that lead to single mode operation in VCSELs, also limit the optical power from the device. The round trip gain through the short cavity is only about 1%, and thus the mirror reflectivities must be very high. In practice, these devices can only give one or two milliwatts of single mode output, which is insufficient for many applications. The power increases with device diameter or drive current, but both tend to excite lateral modes and degrade the output. One substantial advantage of VCSELs is the relatively large circular aperture, which simplifies coupling into optical fibers.

B. Broberg, B. S. Lindgren, M. G. Oberg, and H. Jiang, "A novel integrated optics filter in InGaAsP-InP," J. Lightwave Technology, vol. LT-4, p. 196, 1986 describes a frequency selective filter that operates based on coupling between asymmetric waveguides.

E. Yablonovich, T. J. Gmitter, J. P. Harbison, and R. Bhat, Applied Physics Letter, vol. 51, p.2222 (1987) teaches a technique whereby thin layers of semiconductor can be removed from the substrate and placed on alternate materials.

M. H. MacDougal, P. D. Dapkus, V. Pudikov, H. Zhao, and G. M Yang, "Ultralow threshold vertical-cavity surface-emitting lasers with AlAs Oxide-GaAs distributed bragg reflectors," IEEE Photonics Technology Letters, Vol.7 (3), p.229 (1995), teaches a technique where oxide dielectric layers can be formed underneath active semiconductor material.

U.S. Pat. No. 4,715,672 discloses a type of waveguide that uses anti-resonant layers to confine the light in the waveguide U.S. Pat. No. 5,343,542, teaches a multi-wavelength optical demultiplexer that uses anti-resonant waveguides in an asymmetric coupler configuration.

J. A. Kash, D. W. Kisker, B. Pezeshki, and F. Tong, "Tapered Fabry-Perot multi-wavelength optical source," U.S. patent application Ser. No. 08/145,259 filed on Oct. 29, 1993 and assigned to the assignee of the instant application describes a structure configured as an optical source.

B. Pezeshki, F. Tong, J. A. Kash, and D. W. Kisker, "Vertical cavity devices as wavelength selective elements," Journal of Lightwave Technology, vol. 12 (4) p.1791, (1994) presents a mathematical model for wavelength selective coupling in dissimilar waveguides that use anti-resonant reflecting layers.

SUMMARY OF THE INVENTION

It is therefore an object of this invention to provide a simple method of obtaining single frequency operation in a semiconductor laser without the use of diffraction gratings, regrowths, or other exacting lithographic processes. This invention is an advance over the conventional single frequency lasers because it is much simpler to manufacture, and should be lower in cost. Furthermore, the device emits a fairly symmetric beam from a low index material that is high power and matches the mode of optical fibers.

Using either low index cladding or anti-resonant reflecting layers, this invention fabricates a highly asymmetric waveguide coupler, in a laser structure, with a wavelength resolution high enough to discriminate between longitudinal Fabry-Perot modes. An appropriate pumping structure allows only the mode that couples between the two waveguides to experience gain and thus lase. The overall structure consists of a passive low index waveguide fabricated from a dielectric coupled to an active semiconductor waveguide by a mirror situated between the two waveguides. The waveguides are of a length such that the frequence selective coupling between the waveguides can discriminate between wavelengths of differnt longitudinal modes. The semiconductor is pumped on one side to provide gain, while the other side remains lossy. Only the wavelength that can couple to the low dielectric waveguide from the active semiconductor can avoid the lossy regions and lase. End mirrors are provided on the two ends for the required feedback.

DESCRIPTION OF THE PREFERRED EMBODIMENT

Figure 1:
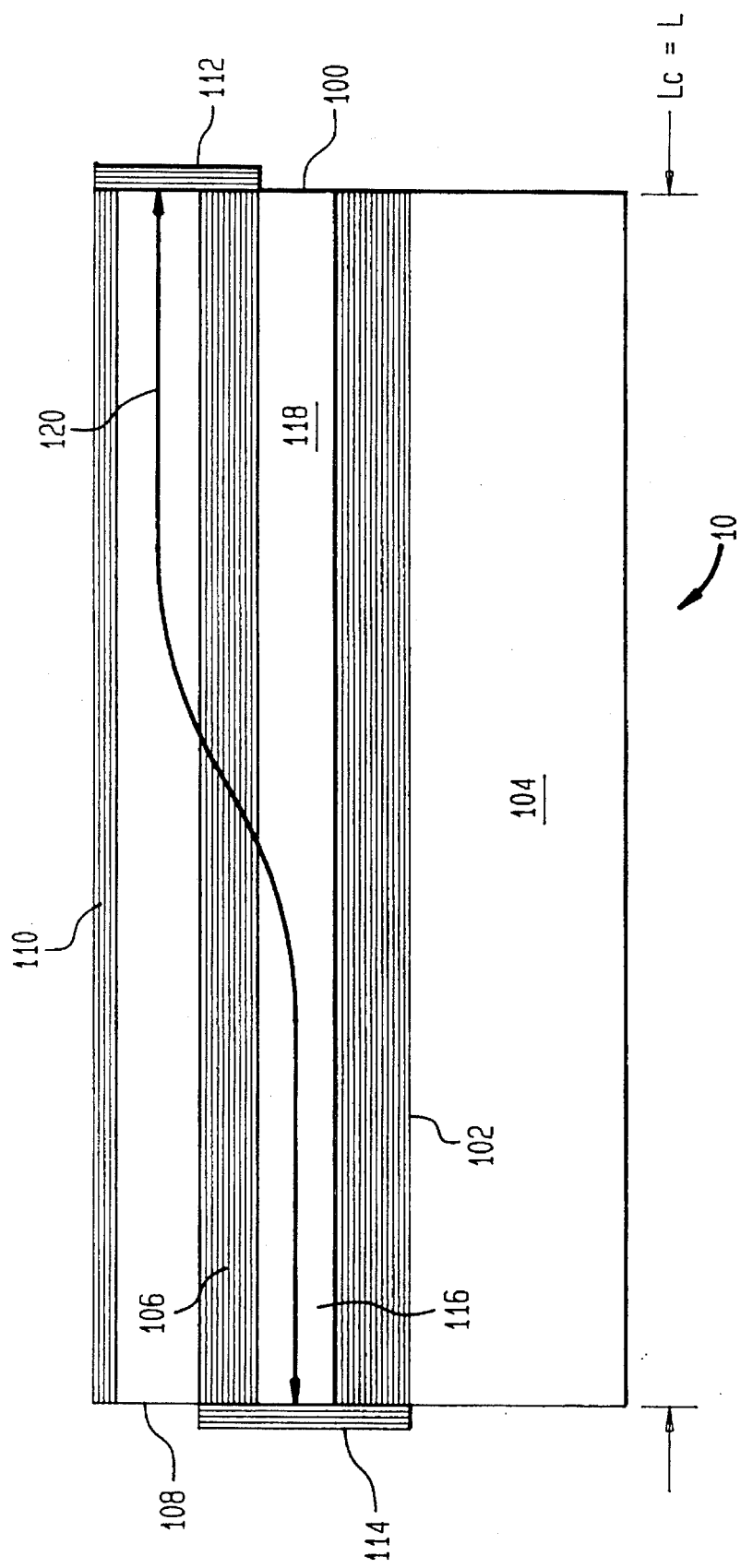
FIG. 1 schematically shows the two waveguides, the mirror that controls the coupling, the end mirrors, and the optical feedback path.

The vertically coupled single frequency laser is shown in FIG. 1 and consists of semiconductor and dielectric layers. The semiconductor portions of this laser structure may be fabricated by techniques such as Molecular Beam Epitaxy (MBE) or Organo-Metallic Chemical Vapor Deposition (OMCVD), while the dielectric materials may be deposited by a variety of less demanding processes. The laser structure consists primarily of two waveguides, one composed of active semiconductor material, and the other from a passive dielectric or polymer. The lower semiconductor waveguide (100) is confined by two mirrors. The lower mirror (102) prevents the light from being lost into the substrate (104), while the central mirror (106) determines the coupling between the semiconductor waveguide (100) and the top dielectric waveguide (108). An upper mirror (110) on top of the dielectric waveguide (108) is also necessary to confine the light in the top waveguide. The mirrors (102, 106, 110) may be fabricated either from lower index materials, such that the light is evanescent in the mirror and thus reflects by total internal reflection, or maybe fabricated from multilayer anti-resonant layers. The fabrication may be simpler if the mirrors are antiresonant since at present there is no simple way to put a very low index material below the semiconductor waveguide. (However refs 2 and 3 demonstrate techniques to do this). Additionally, if the central mirror (106) is an anti-resonant type, the upper waveguide will be lossy for higher order modes and the material-air interface would be adequate as mirror 110, requiring no additional layers to maintain single mode operation. To form a lasing cavity, mirrors are provided on the two ends of the structure, mirror (112) at right side of the top waveguide (108) and mirror (114) at the left side of the lower waveguide (100). These mirrors may simply be a cleaved facet, or posses additional coatings for enhanced reflectivity. This coupled waveguide structure is pumped so as to exhibit gain in the left region (116) the semiconductor waveguide (100) and loss on the left region (118) of the same waveguide. Thus only the optical field that couples between the two guides (120) experiences the gain region and avoids the loss region in order to lase. Electrically, the central mirror (106) can be doped p-type, the bottom mirror (102) n-type and the semiconductor waveguide core (100) left intrinsic. A material capable of optical gain, such as quantum wells would then be placed in the waveguide core (100). Current injection from the p and n side would provide the electrons and holes necessary for gain.

Figure 2:
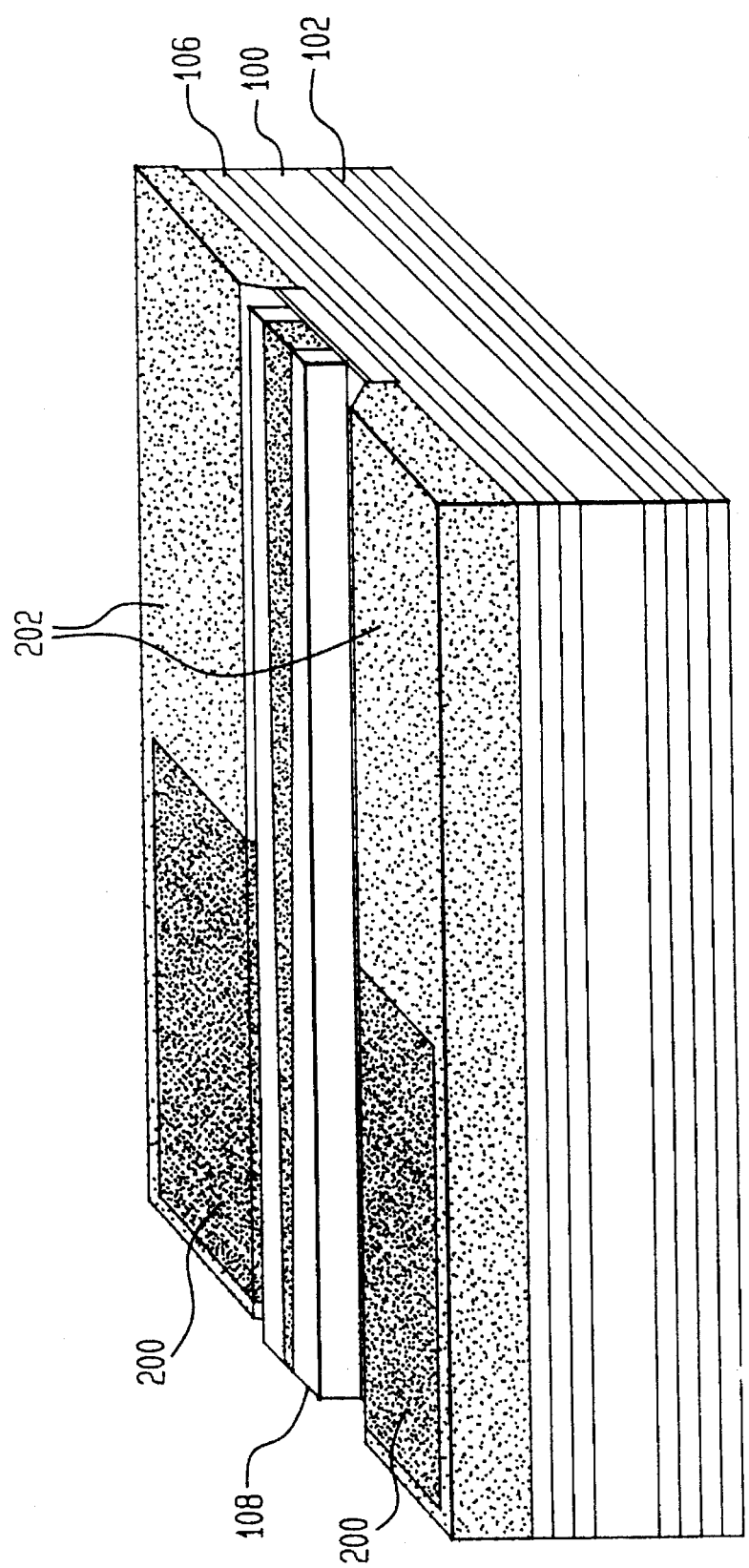
FIG. 2 shows the pumping structure required for such a laser.

The pumping method and lateral confinement necessary are shown in FIG. 2. The central mirror (106) is slightly etched except for a narrow 5–10 μm stripe to provide a lateral index variation. A low index waveguide 108 is then fabricated on top of the unetched region, and metal contact pads (200) are placed on either side of the waveguide to inject current into a portion of the device length. This pumped region (116) would then provide gain while the unpumped region (118) would be lossy. Various techniques can be used for electrical isolation and carrier funneling, such as proton implants, electrical isolation layers such as polyimides (202), or mesa etching. All these techniques are well known in the art and are used in both waveguide and surface-emitting lasers. If all the layers are uniform thickness, then the length of the device should be about one coupling length. If the device is too long, the light would start to couple back into the semiconductor guide, while if it is too short, the transfer between the waveguides would be incomplete. Alternatively, the device can be tapered, for example by tapering the thickness or the width of the core waveguide region (108). This shown schematically in FIG. 2.

Figure 3:
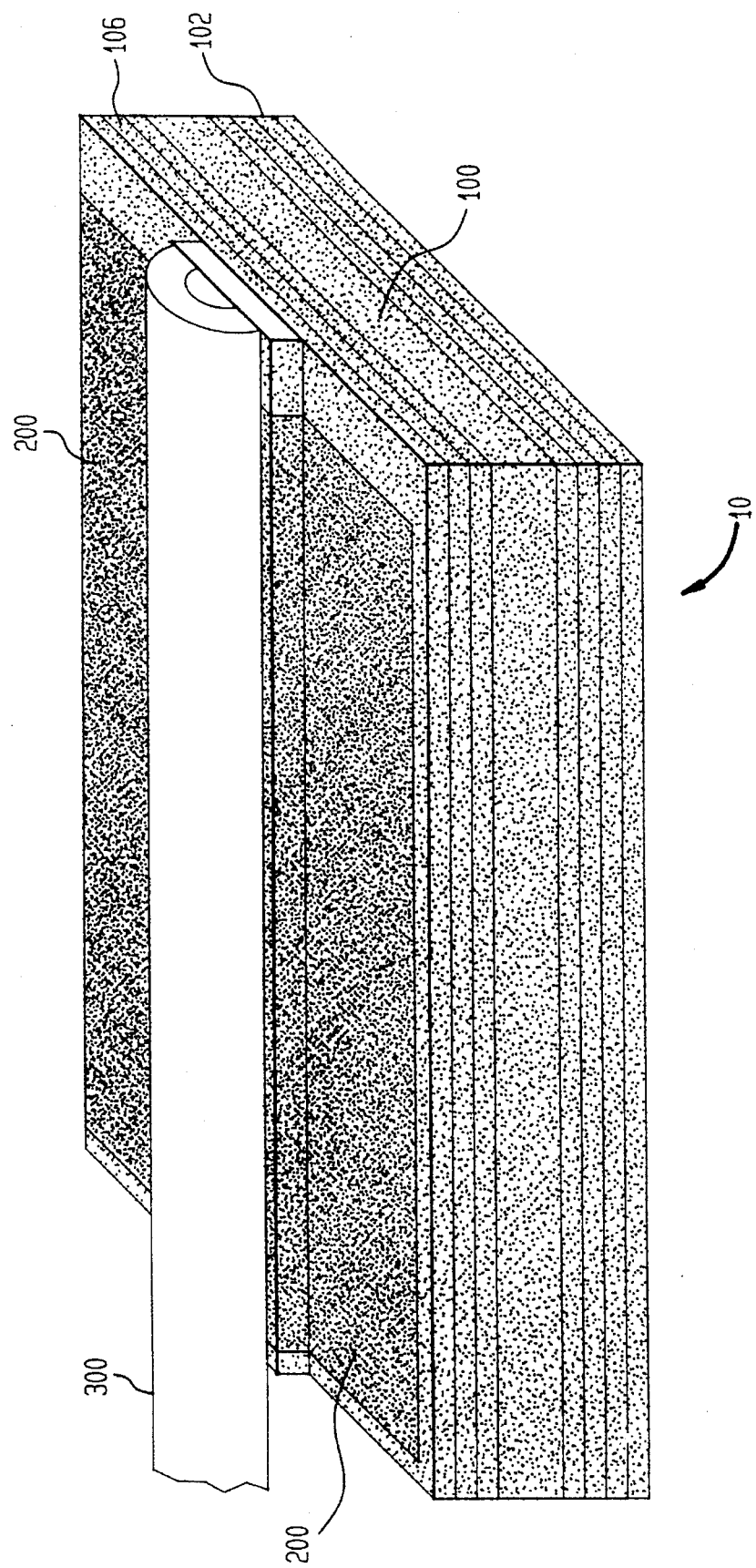
FIG. 3 shows how the device can be used with a D-shaped optical fiber.

Rather than fabricate a separate waveguide 108 on the device, one may use a modified optical fiber (300), shown in FIG. 3. D-shaped fibers are commercially available where the fiber core is close to the flat side of the D. Placing such a fiber directly on top of the semiconductor would realize the coupled waveguide geometry with the light already in an optical fiber mode. To form the end facet mirror 112, one could use a variety of well understood techniques, such as UV-written Bragg mirrors, a partial etch or by simply cleaving the fiber.

Ref. 1 describes a coupled waveguide structure used as a tunable filter, where frequency selective coupling is obtained between dissimilar waveguides. Since Ref. 1 teaches using semiconductors for both waveguides, the frequency selectivity is limited. This frequency selectivity increases with device length and with the degree of asymmetry. By making the waveguides very asymmetric we are able to get high selectivity with a short device length, and thus are able to discriminate between longitudinal Fabry-Perot modes. In a laser structure, this enables single frequency operation.

To obtain such high asymmetry between waveguides different material systems must be used. For example, one waveguide could be made of a dielectric like glass, while the other is a semiconductor. The cladding regions, or mirrors (102, 106) between and on either side of the waveguides (100, 108) must be made of a material with an index lower than both waveguide cores, or from a multi-layer anti-resonant mirror. If the waveguides are highly asymmetric, it becomes difficult to use dielectric layers with an even lower refractive index as the cladding or mirror layers, especially because such a mirror must be placed underneath the semiconductor waveguide (100). Though it may be possible to use epitaxial lift-off (Ref. 2), or selective oxidation of an epitaxial layer (Ref. 3) to form such buried cladding regions, it may be easier to use multi-layer anti-resonant layers to form the mirrors, such as described in the preferred embodiment below. These multi-layer mirrors reflect the beam and confine the light in the waveguides. Known as ARROW, (anti-resonant reflecting optical waveguides), such mirrors has been used in the past to form cladding regions for integrated optics applications (Ref. 4). Unlike the vertical cavity laser, this invention is an edge-emitting device that can be high power on account of the long interaction length. Since the light can be coupled out of the low index waveguide (108), the mode closely matches an optical fiber and should be simple to couple. Most importantly, the device requires no complex lithography to make a grating, as the multi-layers are are all fabricated epitaxially in the growth process.

Directional coupler structures are generally made by forming two identical waveguides close to each other. Since the thicknesses and indices are the same, light of any wavelength can couple from one waveguide to the next. If the waveguides are dissimilar, then phase-matching can still occur at a particular wavelength if the layer thicknesses are made to compensate for the differing refractive index. This compensation only occurs at one particular wavelength, thus the device is frequency selective. The more dissimilar the two waveguides, the sharper is the resolution of the device. This principle has been used previously for tunable filters (eg in Ref. 1). In general one can write the wavelength resolution of such an asymmetric coupler, using a the first order mode of each waveguide as (Ref. 5,7):

$$\Delta\lambda_{res} = \frac{5\beta\lambda^3}{4\pi^2(n_2^2 - n_1^2)L_c} \qquad (1)$$

where $\beta$ is the propagation mode of the light, $\lambda$ is the wavelength, $n_1$ and $n_2$ are the refractive indices of the two waveguides, and $L_c$ is the coupling length. In order for a laser structure to pick only a single longitudinal mode, this wavelength resolution has to be comparable to the longitudinal mode spacing $\Delta\lambda_{long}$. Neglecting dispersion in the material, one can write the spacing between these Fabry-Perot longitudinal modes as:

$$\Delta\lambda_{long} = \frac{\pi\lambda}{2\beta L} \qquad (2)$$

Thus, setting $\Delta\lambda_{long} \geq \Delta\lambda_{res}$, the device length L equal to the coupling length $L_c$, and assuming the effective index closely matches the top waveguide, we get that the asymmetry between the waveguides has to be such that $$n_2 \geq 1.6 n_1 \qquad (3)$$

Though satisfying equation (3) is very hard for all semiconductor materials, it becomes feasible if one material is dielectric and the second is a semiconductor. In such a device the wavelength resolution of the coupling is adequate to discriminate between longitudinal Fabry-Perot modes and result in a single mode laser. Such a coupled waveguide structure is shown schematically in FIG. 1.

The physics can be explained both in terms of vertical cavity resonators and coupled waveguides. With antiresonant mirrors, the structure resembles a vertical cavity resonator, but instead of coupling to a $\beta$=0 mode normal to the layers in free space, we now couple to a low $\beta$ value of a waveguide mode on the top layers. As long as the top waveguide is very different from the semiconductor layers, high wavelength selectivity is obtained. The structure also resembles a directional coupler, with the semiconductor resonator and the dielectric forming the two waveguides.

Ref. 7 demonstrates the frequency selectivity of the coupling in a directional coupler structure for a multi-wavelength device. Using indices of 3.5 for the semiconductor and 1.6 for a polymer, a Full Width Half Maximum (FWHM) resolution of 0.5 nm can be obtained with a coupling length of about 100 μms. The propagation in these resonant cavities can have losses less than 1 dB over the coupling length, and the transfer process from one waveguide to the next can have efficiencies of close to 100%. Thus all the components necessary for such a laser structure have been independently verified.

To assure efficient coupling between the two waveguides, one can either adjust the device length to the coupling length, or produce a taper in the structure. With uniform layers, the light will transfer from the semiconductor to the top waveguide in one coupling length. Alternatively, one can use a longer structure and use a taper in the waveguides to assure unidirectional coupling. This can be achieved either by a taper in the semiconductor layers, or by tapering the width of the top waveguide lithographically.

Ideally, one would require the semiconductor waveguide to act single mode in the lateral direction. In the same way that ridge waveguides are fabricated for conventional lasers, etching the semiconductor layers before depositing the top waveguide will form a slight lateral index modulation required for a single mode guide. The top waveguide can also be made single mode by using lateral index variations. In the previous demultiplexer of Ref. 7 lateral confinement was achieved by modifying the index in a polymer with UV exposure. Other techniques such as burying the the core with cladding or dopant diffusion would also be effective.

To provide for electrical pumping of the gain material in the lower semiconductor waveguide 100, the material can be doped to form a p-i-n structure and contact pads placed on one side of the device, as in FIG. 2. Either a proton implant or dielectric material can be used to isolate the metal contact pad to assure injection only into the waveguides. If necessary, buried implants can funnel the carriers directly to the active region, as demonstrated in VCSEL structures.

The structure of this invention can also be very useful for integrated optics applications. For example the top dielectric could have non-linear optical properties, or contain Acousto-Optic (AO) elements for scanning the laser beam. Alternatively, instead of coupling the waveguide to an optical fiber, one can use a D-shaped fiber on top of the device, as shown in FIG. 3. The output end mirror could then be an induced mirror in the optical fiber. Not only would the mode exactly match the fiber, but fiber to device alignment costs could also be drastically reduced.

Putting such dissimilar materials together in the device requires either a novel processing technique such as epitaxial lift-off or selective oxidation of buried layers, or alternatively the use of anti-resonant mirrors. In the past we showed how anti-resonant mirrors can be used to combine a dielectric waveguide with a semiconductor resonator for multi-wavelength devices. Including a taper in the thickness of one of the guides caused different wavelengths to couple out of a fiber at different positions (Ref. 5). In an active device we could generate narrow band emission from a device using the same filter characteristics (Ref 6.). In this patent application we explain how this technique can be used to fabricate a single frequency laser, useful as a low cost substitute for DFB lasers.

The exact design of such a laser is quite straightforward. The various performance parameters of the structure are computed using the same equations as in our previously demonstrated paper (Ref. 7). Contacts, isolation, and feedback for laser operation must be added to the simple demultiplexer described previously. These techniques are already known in the art.

Starting with the top waveguide (108), one can compute the waveguide mode angle from the thickness and the refractive index. In our experiments, we used a low index polymer as the top waveguide (108). Typically such polymers have an index about 1.6, and a thickness of 5 μm makes a close match to an optical fiber mode. At a wavelength of 0.85 μms, the mode angle would then be about 87 degrees from the normal. The angle in the semiconductor layers (100, 116, and 118) can then be calculated from Snell's law, and the thickness of the layers suitably adjusted to give ¼ wave at the appropriate mode angle in each layer. For AlAs, (n=3.0), the mode angle would be 32 degrees with a corresponding thickness of 81.7 nm. For $Al_{0.3}Ga_{0.7}As$ the mode angle is 28 degrees with a corresponding thickness of 67.8 nm. A one wave lower waveguide or cavity (100) of $Al_{0.2}Ga_{0.8}As$ would require a thickness of 266 nm. A six period central mirror (106) of $AlAs/Al_{0.3}Ga_{0.7}As$ would have a reflectivity of 0.99, a coupling length of 200 microns, and a wavelength resolution of better than 1 nm. A bottom mirror (102) with 30.5 periods would have a reflectivity of 99.99%. Three 7.5 nm GaAs quantum wells at the center of the bottom semiconductor waveguide (100) should provide about 3% gain in each traverse, corresponding to a gain of $\alpha=600$ cm$^{-1}$. (The effective cavity length, including the penetration depth into the mirrors is about 930 nm, and the mode travels about 30 degrees to the normal). The central mirror (106) is doped p-type and the lower mirror (102) is doped n-type both at about $3\times10^{18}/cm^3$. This doping induces some optical loss, along with scattering at the interfaces, the loss at the end mirrors (112, 114) and top waveguide (108) loss. Experimentally we have found that gain from 3 QWs is adequate to overcome these losses in a 200 micron device. Lateral confinement in the top waveguide can be realized by etching the polymer in a ridge structure. Using conventional waveguide equations, a 10 μm wide and 5 μm thick waveguide will stay single mode if the etch depth is about 1 micron. Lateral confinement in the semiconductor can also be realized by slightly etching the central mirror (106). A 5 nm etch would produce an effective index difference of 0.015 which provides more than adequate confinement.

The processing of the device is a modification of known techniques for surface-emitting lasers. A deep proton implant would restrict current flow everywhere except in the semiconductor layers under the top waveguide. A shallow proton implant provides device isolation. Contacts on either side of the top waveguide provide current injection through the top p-type mirror, while an ohmic contact to the back side of the substrate provides the contact to the n-type side. Current is injected along ½–¾ of a 200 micron device, while the remaining part of the device remains lossy. Cleaves on both sides of the device function as the output coupler. The polymer reflector can be coated to reduce the threshold of the device if desired.

In conclusion, we have described a novel laser structure with an intra-cavity frequency selective element that assures single mode operation. Such a vertical grating is much simpler to fabricate than lithographic gratings used in DFB or DBR lasers. Furthermore, the light output emanates from a thick symmetric waveguide that will lower the coupling loss to optical fibers or in integrated optics applications.

References 1 through 7 are incorporated herein by reference.

References

1. B. Broberg, B. S. Lindgren, M. G. Oberg, and H. Jiang, "A novel integrated optics filter in InGaAsP-InP," J. Lightwave Technology, vol. LT-4, p. 196, 1986.

2. E. Yablonovich, T. J. Gmitter, J. P. Harbison, and R. Bhat, Applied Physics Letter, vol.51, p.2222 (1987).

3. M. H. MacDougal, P. D. Dapkus, V. Pudikov, H. Zhao, and G. M Yang, "Ultralow threshold vertical-cavity surface-emitting lasers with AlAs Oxide-GaAs distributed bragg reflectors," IEEE Photonics Technology Letters, Vol. 7 (3), p.229 (1995).

4. M. A. Duguay, T. L. Koch, Y. Kokubun, and L. Pfeiffer, U.S. Pat. No. 4,715,672, "Optical waveguide utilizing an antiresonant layered structure", Dec. 29, 1987.

5. J. A. Kash, B. Pezeshki, and F. Tong, U.S. Pat. No. 5,343,542, "Tapered Fabry-Perot waveguide optical demultiplexer," Aug. 30, 1994.

6. J. A. Kash, D. W. Kisker, B. Pezeshki, and F. Tong, "Tapered Fabry-Perot multi-wavelength optical source," Patent filed YO993-102, Ser. No. 08/145,259, Oct. 29, 1993

7. B. Pezeshki, F. Tong, J. A. Kash, and D. W. Kisker, "Vertical cavity devices as wavelength selective elements," Journal of Lightwave Technology, vol. 12 (4) p. 1791. (1994).

Having thus described our invention, what we claim and desire to secure by Letters Patents is:

1. A laser structure for oscillating light in a single longitudinal mode, said structure comprising:
    a. a pair of coupled but dissimilar waveguides that are collinear with each other and that are phase matched to permit coupling between each of said waveguides, where said waveguides are of such a length that frequency selective coupling between said waveguides can discriminate between wavelengths corresponding to different longitudinal modes, each of said waveguides having semiconductor material capable of providing optical gain when electrically excited to therefore form a lasing medium;
    b. a pair of end mirrors at opposite ends of said waveguides with one of said waveguides having a mirror on its left side and the other of said waveguide having a mirror on its right side, thus providing feedback for laser oscillation; and
    c. a mirror in contact with and separating said pair of waveguides, whereby only said light coupled between said pair of waveguides experiences net optical gain.

2. A structure as recited in claim 1, wherein said mirror separating said pair of waveguides is a multi-layer mirror having anti-resonant layers.

3. A structure as recited in claim 1, further comprising a means for pumping one of said waveguides for only a portion of its length, with optical loss occurring in said one waveguide outside of said portion.

4. A structure as recited in claim 1, wherein one of said waveguides is a optical fiber.

5. A structure as recited in claim 1, wherein there is some taper along the length of at least one of said waveguides to cause the propagation constant of light to vary spatially along the length of said one waveguide.

6. A structure as recited in claim 1, wherein one of said waveguides is a non-linear optical material.

* * * * *